United States Patent
Suzuki

(10) Patent No.: US 9,070,961 B2
(45) Date of Patent: Jun. 30, 2015

(54) HIGH-FREQUENCY CIRCUIT PACKAGE AND SENSOR MODULE

(75) Inventor: Takuya Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1124 days.

(21) Appl. No.: 13/062,349

(22) PCT Filed: Sep. 2, 2009

(86) PCT No.: PCT/JP2009/065345
§ 371 (c)(1),
(2), (4) Date: Mar. 4, 2011

(87) PCT Pub. No.: WO2010/026990
PCT Pub. Date: Mar. 11, 2010

(65) Prior Publication Data
US 2011/0163919 A1    Jul. 7, 2011

(30) Foreign Application Priority Data
Sep. 5, 2008   (JP) ................... 2008-228835

(51) Int. Cl.
*H05K 1/11* (2006.01)
*H05K 1/14* (2006.01)
(Continued)

(52) U.S. Cl.
CPC ........... *H01P 5/107* (2013.01); *H01L 23/49816* (2013.01); *H01L 23/50* (2013.01);
(Continued)

(58) Field of Classification Search
CPC .............. H01L 2223/6622; H01L 2223/6627; H01L 2223/6677; H01L 2224/16225; H01L 23/49816; H01L 23/50; H01L 23/552; H01L 23/585; H01L 23/66; H01L 25/18; H01L 2924/1903; H01L 2924/19032; H01P 5/107
USPC .......... 361/803, 818, 777; 257/659, 686, 773, 257/668; 333/254, 246, 248
See application file for complete search history.

(56) References Cited

U.S. PATENT DOCUMENTS 6,130,483 A    10/2000  Shizuki et al.
6,297,551 B1   10/2001  Dudderar et al.
(Continued)

FOREIGN PATENT DOCUMENTS

EP   1 195 839 A1   4/2002
JP   5 343904       12/1993
(Continued)

OTHER PUBLICATIONS

Extended European Search Report issued Jun. 15, 2012 in Patent Application No. 09811515.7.
(Continued)

*Primary Examiner* — Yuriy Semenenko
(74) *Attorney, Agent, or Firm* — Oblon, McClelland, Maier & Neustadt, L.L.P.

(57) ABSTRACT

Shielding of high-frequency circuits is achieved using a simple and inexpensive configuration not using any lid. A high-frequency circuit mounting substrate (20) is disposed, on an underside surface layer of which are disposed high-frequency circuits (21 and 22) and is formed a first grounding conductor that has same electric potential as grounding conductors of the high-frequency circuits and that surrounds the high-frequency circuits. A mother control substrate (3) is disposed, on which the high-frequency circuit mounting substrate (20) is mounted in such a way that the high-frequency circuits are sandwiched therebetween and on which a second grounding conductor is formed in a region facing the high-frequency circuits. Plural first lands are formed on the first grounding conductor of the high-frequency circuit mounting substrate (20) to surround the high-frequency circuits. Plural second lands are formed that are electrically connected to the second grounding conductor at positions on a surface layer of the mother control substrate (3) which face the first lands. Plural solder balls (30G2) are disposed for connecting the first lands and the second lands. The high-frequency circuits are housed in pseudo shielding cavities surrounded by the solder balls (30G2), the grounding conductors of the high-frequency circuits, and the first and second grounding conductors.

9 Claims, 5 Drawing Sheets

(51) Int. Cl.

| | |
|---|---|
| *H01P 5/107* | (2006.01) |
| *H01L 23/552* | (2006.01) |
| *H01L 23/58* | (2006.01) |
| *H01L 23/66* | (2006.01) |
| *H01L 25/18* | (2006.01) |
| *H05K 1/02* | (2006.01) |
| *H01L 23/498* | (2006.01) |
| *H01L 23/50* | (2006.01) |
| *H05K 3/34* | (2006.01) |

(52) U.S. Cl.
CPC ........... *H01L 23/552* (2013.01); *H01L 23/585* (2013.01); *H01L 23/66* (2013.01); *H01L 25/18* (2013.01); *H01L 2223/6622* (2013.01); *H01L 2223/6627* (2013.01); *H01L 2223/6677* (2013.01); *H01L 2924/1903* (2013.01); *H01L 2924/19032* (2013.01); *H01L 2924/3011* (2013.01); *H05K 1/0219* (2013.01); *H05K 1/0222* (2013.01); *H05K 1/0243* (2013.01); *H05K 3/3436* (2013.01); *H05K 2201/09618* (2013.01); *H05K 2201/10734* (2013.01); *H01L 2224/16225* (2013.01); *H01L 2924/15321* (2013.01)

(56) References Cited

U.S. PATENT DOCUMENTS

| | | | |
|---|---|---|---|
| 7,336,221 B2 | 2/2008 | Matsuo et al. | |
| 7,405,477 B1* | 7/2008 | Tao et al. | 257/728 |
| 7,514,789 B1 | 4/2009 | Tao et al. | |
| 8,254,144 B2* | 8/2012 | Matsumoto et al. | 361/803 |
| 8,358,185 B2* | 1/2013 | Ohno et al. | 333/254 |
| 2002/0044033 A1 | 4/2002 | Tamaki | |
| 2002/0074654 A1 | 6/2002 | Koriyama | |
| 2004/0155723 A1 | 8/2004 | Koriyama | |
| 2004/0208416 A1* | 10/2004 | Chakravorty et al. | 385/14 |
| 2006/0226928 A1 | 10/2006 | Henning et al. | |
| 2007/0095922 A1 | 5/2007 | Kawai | |
| 2011/0175793 A1* | 7/2011 | Suzuki | 343/905 |

FOREIGN PATENT DOCUMENTS

| | | |
|---|---|---|
| JP | 8 250913 | 9/1996 |
| JP | 8 330696 | 12/1996 |
| JP | 10 308478 | 11/1998 |
| JP | 2001-135775 A | 5/2001 |
| JP | 2002 185203 | 6/2002 |
| JP | 2006 287962 | 10/2006 |

OTHER PUBLICATIONS

Japanese Office Action issued Dec. 25, 2012 in patent Application No. 2010-527796 with partial English Translation.
Japanese Office Action issued Dec. 25, 2012 in patent Application No. 2011-065740 with partial English Translation.
Combined Chinese Office Action and Search Report issued Dec. 20, 2012 in patent Application No. 200980135948.5 with partial English translation and English translation of category of cited documents.
Office Action issued Jan. 6, 2014 in European Patent Application No. 09 811 515.7.
Office Action mailed Nov. 29, 2013 in co-pending U.S. Appl. No. 13/075,779.
International Search Report issued Oct. 20, 2009 in PCT/JP09/65345 filed Sep. 2, 2009.
Combined Chinese Office Action and Search Report issued Mar. 12, 2014 in Patent Application No. 200980135948.5 with Partial English Translation and English Translation of Category of Cited Documents.
Office Action issued Jun. 20, 2014 in U.S. Appl. No. 13/075,779.
Office Action issued Jan. 20, 2015 in Chinese Patent Application No. 200980135948.5 (with partial English translation).
Office Action issued Apr. 20, 2015, in co-pending U.S. Appl. No. 13/075,779.

* cited by examiner

HIGH-FREQUENCY CIRCUIT PACKAGE AND SENSOR MODULE

FIELD

The present invention relates to a high-frequency circuit package in which a high-frequency circuit mounting substrate having a high-frequency circuit mounted thereon and a mother control substrate having a waveguide formed thereon are BGA-connected with solder balls, and relates to a sensor module.

BACKGROUND

In a high-frequency package, in which high-frequency circuits are mounted that operate in high-frequency bands such as millimeter wave bands, the high-frequency circuits are mounted in a cavity that is electrically shielded using a seal ring, a lid and the like, taking airtightness for weather resistance, operating stability and the EMI (radioactive spurious) standard into consideration.

In Patent Document 1, a semiconductor chip and a circuit substrate are mounted in an outer case. In order to establish a connection with a waveguide disposed on the downside of the circuit substrate and the outer case, a dielectric window having a stripline antenna formed thereon is disposed immediately above the waveguide. The stripline antenna is connected to the circuit substrate via a stripline so that the waveguide disposed below the dielectric window is connected thereto. The upside opening of the outer case is sealed with a lid in an airtight manner.

CITATION LIST

Patent Literature

Patent Document 1: Japanese Patent Application Laid-open No. H05-343904 (FIG. 3)

SUMMARY

Technical Problem

In the conventional package structure, the high-frequency circuits are shielded by the lid and the outer case that serves as a seal ring. Hence, as far as the cost and high-volume production is concerned, there exist a lot of barriers such as an increase in the number of components including the lid and the seal ring, and an increase in the complexity of the manufacturing process including performing solder joints to the package and performing welding of the lid. Thus, there has been a demand for a simple package structure and a simple module configuration that would enable achieving electromagnetic shielding and isolation at a low cost even for high-frequency bands such as microwave bands or millimeter wave bands.

In recent years, with the advance in the development regarding weather resistance enhancement of semiconductor chips or high-frequency circuits, protective films are formed over semiconductor circuits in order to achieve reliability that is required in a system. That has led to the implementation of non-airtight packages for, e.g., modules in which circuits are mounted directly on a resin substrate.

The present invention has been made in view of the above and an object thereof is to provide a high-frequency circuit package and a sensor module that enable achieving shielding of high-frequency circuits or achieving isolation among a plurality of high-frequency circuits using a simple and inexpensive configuration and not using any lid.

Solution to Problem

To solve the problem described above and achieve the object, the present invention includes: a first dielectric substrate having a high-frequency circuit disposed on an underside surface layer and having a first grounding conductor that has same electric potential as a grounding conductor of the high-frequency circuit and that is formed on the underside surface layer to surround the high-frequency circuit; and a second dielectric substrate, on which the first dielectric substrate is mounted in such a way that the high-frequency circuit is sandwiched therebetween, the second dielectric substrate having a line formed thereon for supplying a signal to drive the high-frequency circuit and having a second grounding conductor formed in a region that faces the high-frequency circuit, wherein a plurality of first lands are formed on the first grounding conductor of the first dielectric substrate to surround the high-frequency circuit, and a plurality of second lands are electrically connected to the second grounding conductor and are formed at positions on a surface layer of the second dielectric substrate which face the plurality of first lands, a plurality of conductive connecting members are disposed for connecting between the first lands and the second lands, and the high-frequency circuit is housed in a pseudo shielding cavity that is surrounded by the plurality of conductive connecting members, the first and second grounding conductors, and the grounding conductor of the high-frequency circuit.

Advantageous Effects of Invention

According to the present invention, the high-frequency circuit formed on the underside surface layer of the first dielectric substrate is housed in the pseudo shielding cavity that is surrounded by the conductive connecting members formed around the high-frequency circuit, first and second grounding conductors, and grounding conductor of the high-frequency circuit. Hence, it becomes possible to shield the high-frequency circuit using a simple and inexpensive configuration and not using any lid.

DESCRIPTION OF EMBODIMENTS

An exemplary embodiment for a high-frequency circuit package and a sensor module according to the present invention will be described below in detail with reference to the accompanying drawings. The present invention is not limited to the embodiment described below.

Figure 1:
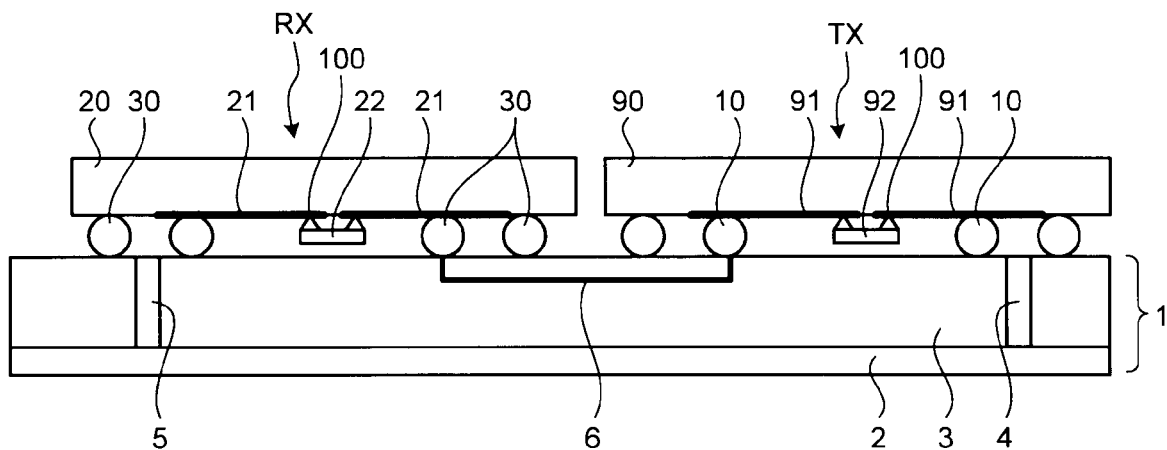
FIG. 1 is a cross-sectional view of a sensor module according to an embodiment of the present invention.

FIG. 1 is a diagram illustrating a configuration of a sensor module according to an embodiment of the present invention. The sensor module is applicable to a millimeter-wave radar that transmits and receives radio waves of millimeter wave bands. On a control antenna substrate 1 having a power source for high-frequency circuits mounted thereon and having control circuits mounted thereon, a transmitting circuit package TX and a receiving circuit package RX are also mounted as high-frequency circuit packages. In the transmitting circuit package TX as well as in the receiving circuit package RX, a plurality of high-frequency circuits are mounted that operate in high-frequency bands such as microwave bands or millimeter wave bands. In the transmitting circuit package TX as well as in the receiving circuit package RX, the high-frequency circuits are housed in a non-airtight manner but with adequate humidity resistance. The circulation of water molecules between the inside and the outside of the packages is not blocked. Meanwhile, the millimeter-wave radar can be a FW-CW radar, a pulse radar, a multifrequency CW radar, or the like; but the radar method is not limited thereto. The sensor module can also be applied to communication devices or to microwave radars.

The control antenna substrate 1 is configured as an integrated structure of a resin antenna substrate 2 having antenna patterns (antenna elements) arranged thereon and a mother control substrate 3 made of resin and having a transmitting waveguide 4, a receiving waveguide 5 (one or more), and a triplet line 6 formed thereon. The control antenna substrate 1 is configured by bonding a resin substrate having excellent high-frequency transmission characteristic and a dielectric substrate made of ceramic or the like. Apart from the transmitting circuit package TX and the receiving circuit package RX, various non-illustrated control circuits (various electronic circuits such as ICs, microcomputers, or capacitors) are mounted on a top surface of the control antenna substrate 1. The triplet line 6 includes an inner line, a shielding ground, and a shielding through hole. The receiving waveguide 5 is disposed in plurality to form a multiple-channel configuration. Alternatively, it is also possible to have a single-channel configuration with a single receiving waveguide 5.

The transmitting circuit package TX includes a high-frequency circuit mounting substrate 90, which is made of a dielectric substrate such as resin or ceramic having excellent high-frequency transmission characteristic. On an underside surface layer of the high-frequency circuit mounting substrate 90 (i.e., on the surface layer of the side facing the control antenna substrate 1), high-frequency circuits for transmission 91 are formed and a high-frequency semiconductor chip for transmission 92 is mounted. As the high-frequency circuits for transmission 91 (92), for example, there are disposed an oscillator circuit for generating a high-frequency signal of frequency f0, an amplifier circuit for amplifying the output of the oscillator circuit, a directional coupler for outputting the output of the amplifier circuit to a multiplier/amplifier circuit and to the triplet line 6, and the multiplier/amplifier circuit for multiplying the output of the amplifier circuit by N (N≥2) and outputting a multiplying signal of frequency N·f0 by means of amplification. The operations of the high-frequency circuits for transmission 91 (92) are controlled by the control circuits mounted on the control antenna substrate 1. The high-frequency circuits for transmission 91 (92) transmit transmitter pulses via a microstrip line-waveguide converter and via the transmitting waveguide 4 and the antenna formed on the control antenna substrate 1. The transmitting waveguide 4 is disposed in plurality to form a multiple-channel configuration. Alternatively, it is also possible to have a single-channel configuration with a single transmitting waveguide 4.

The control antenna substrate 1 and the multilayer dielectric substrate 90 of the transmitting circuit package TX are connected by BGA balls (solder balls) 10. DC bias and signal connection are made using the BGA balls 10. In this example, a local oscillation wave signal (LOCAL signal) of frequency f0, which is used in the high-frequency circuits for transmission 91 (92) of the transmitting circuit package TX, is input to the receiving circuit package RX via the directional coupler, the BGA balls 10, the triplet line 6 of the control antenna substrate 1, and BGA balls 30.

The receiving circuit package RX includes a high-frequency circuit mounting substrate 20 (hereinafter, referred to as high-frequency resin substrate), which is made of a dielectric substrate of resin or ceramic having excellent high-frequency transmission characteristic. On an underside surface layer of the high-frequency resin substrate 20 (i.e., on the surface layer of the side facing the control antenna substrate 1), high-frequency circuits for reception 21 are formed and a high-frequency semiconductor chip 22 is mounted. As the high-frequency circuits for reception 21, for example, an input-output pattern wiring that forms portions of mixer circuits, a power divider, and an RF circuit such as a waveguide converter can be exemplified. As the high-frequency semiconductor chip 22, for example, an APDP (anti-parallel diode pair) that forms portions of mixers and a chip resistor used in the power divider can be exemplified. The high-frequency semiconductor chip 22 is mounted on the high-frequency resin substrate 20 using Au bumps 100 by means of flip-chip bonding.

The BGA balls 30 are disposed as conductive connecting members on the underside surface layer of the high-frequency resin substrate 20 that faces the mother control substrate 3. The BGA balls 30 perform the following functions.

1) DC bias and signal connection between the high-frequency semiconductor chip 22 and the control circuits mounted on the control antenna substrate 1

2) Establishing connection of the local oscillation wave signal (LOCAL signal) with the triplet line 6 formed on the control antenna substrate 1

3) Forming cavities for achieving operating stability of individual circuits (mixers, power dividers, etc.)

4) Securing spatial isolation among a plurality of channels

Figure 2:
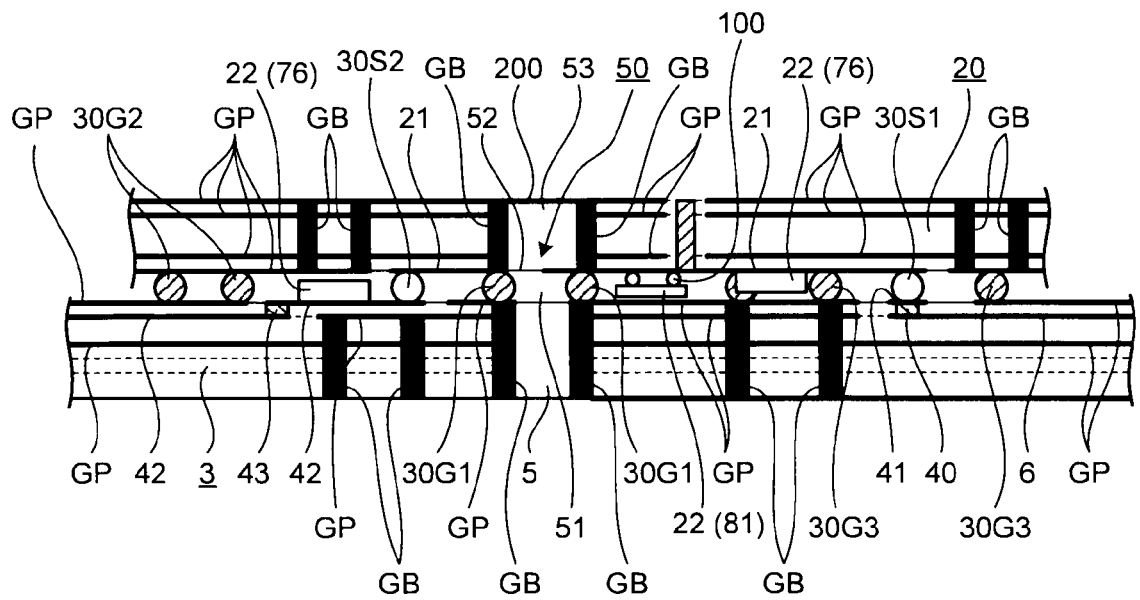
FIG. 2 is a cross-sectional view of a high-frequency circuit package according to the embodiment of the present invention.
Figure 3:
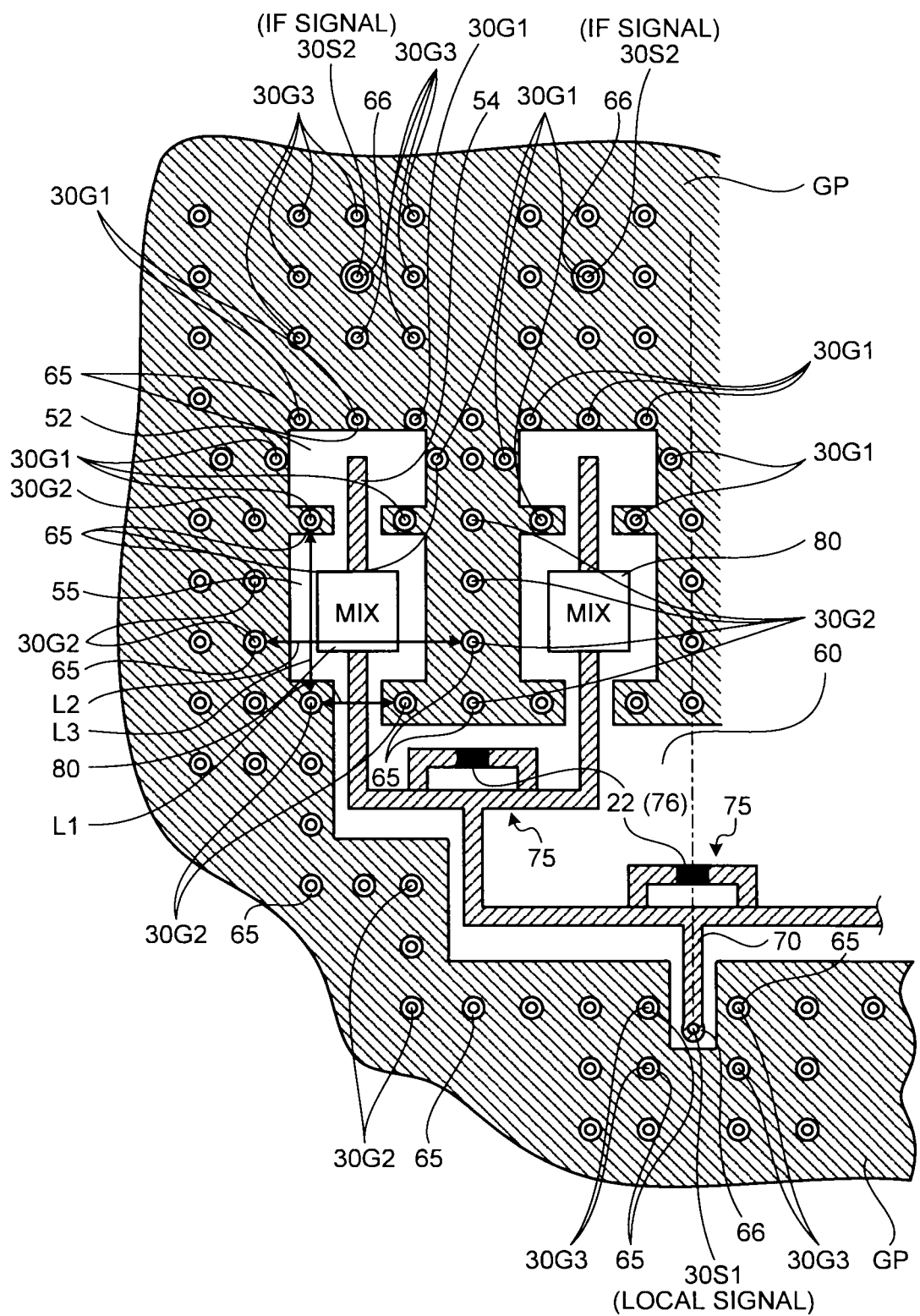
FIG. 3 is a plan view of an arrangement example of high-frequency circuits, high-frequency semiconductor chips, and BGA balls formed on an underside surface layer of a high-frequency resin substrate in the high-frequency circuit package according to the embodiment of the present invention.
Figure 4:
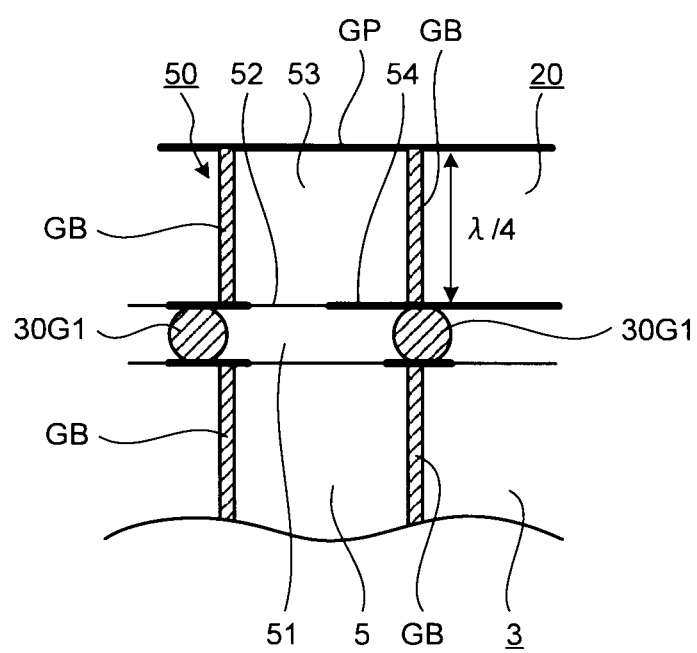
FIG. 4 is a cross-sectional view of a configuration of a waveguide-microstrip converter portion formed in the high-frequency circuit package according to the embodiment of the present invention.
Figure 5:
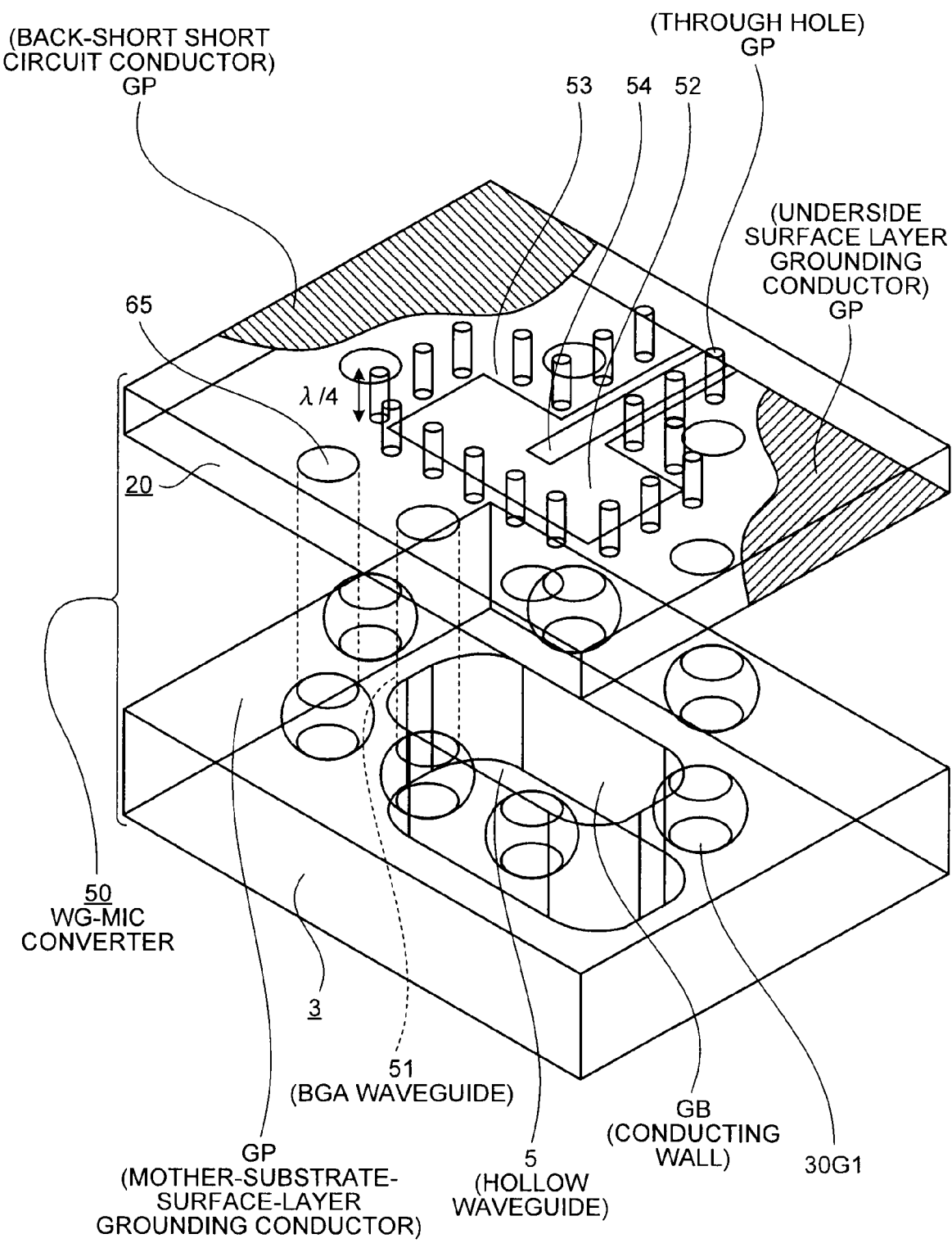
FIG. 5 is a perspective view of the configuration of the waveguide-microstrip converter portion formed in the high-frequency circuit package according to the embodiment of the present invention.

5) Electromagnetic shielding (in place of the lid) for the receiving circuit in entirety 6) Preventing leakage of spurious waves Explained below with reference to FIGS. 2 to 5 are the details regarding the receiving circuit package RX. Regarding the transmitting circuit package TX, since the package structure is identical to that of the high-frequency resin substrate 20 of the receiving circuit package RX, the detailed explanation thereof is not repeated with reference to FIGS. 2 to 5. FIG. 2 is a cross-sectional view of the high-frequency resin substrate 20 and the mother control substrate 3. FIG. 3 is a plan view of an arrangement example of the high-frequency circuits 21, high-frequency semiconductor chips 22, and BGA balls 30 formed on the underside surface layer of the high-frequency resin substrate 20. FIG. 4 is a cross-sectional view of a configuration of a waveguide-microstrip converter portion formed on the high-frequency resin substrate 20. FIG. 5 is a perspective view of the configuration of the waveguide-microstrip converter portion formed on the high-frequency resin substrate 20. In the present embodiment, although the explanation is given for the exemplary case of four receiving channels, only a single channel is illustrated in FIG. 2 and only two channels are illustrated in FIG. 3. In FIG. 3, an example of a substantially half arrangement of the high-frequency circuits 21 and the BGA balls 30 is illustrated for two channels. Meanwhile, the total number of channels formed on the high-frequency resin substrate 20 is not limited to four. That is, it is not only possible to have two or three channels but also possible to have five or more channels.

In FIG. 2, on the surface layer and on an inner layer of the mother control substrate 3 are formed grounding conductor patterns GP (ground planes) that are grounded in terms of high frequencies. The grounding conductor patterns GP are connected to grounding conductor vias GB (ground vias) illustrated by means of blackening. The grounding conductor vias GB are formed in the substrate lamination direction of the mother control substrate 3. As illustrated in FIGS. 4 and 5, the waveguide 5 is formed by the grounding conductor vias GB arranged at predetermined intervals (intervals equal to or smaller than ¼ of an in-dielectric-substrate effective wavelength $\lambda$ of high-frequency signals) and by the dielectric body forming the mother control substrate 3. As the waveguide 5, a hollow waveguide as illustrated in FIG. 5 can be used.

In the mother control substrate 3, the triplet line 6 is formed for transmitting to the high-frequency resin substrate 20 the LOCAL signal that is used in the high-frequency circuits for transmission 91 (92) of the transmitting circuit package TX. A signal via 40 is formed that is connected to the triplet line 6, and a contact pad 41 is formed on the surface layer and connected to the signal via 40. Moreover, in the mother control substrate 3, a signal line 42 and a signal via 43 are formed for transmitting the output signals from the high-frequency resin substrate 20 (for example, intermediate frequency signals (IF signals) that are the output signals of the mixers) to the control circuits mounted on the mother control substrate 3. Furthermore, although described later in details, in the region on the mother control substrate 3 which faces the high-frequency circuits for reception 21 (including the high-frequency semiconductor chip 22) formed on the underside surface layer of the high-frequency resin substrate 20, grounding conductor patterns GP are formed for stabilizing the operations of the high-frequency circuits 21. The grounding conductor patterns GP formed in the region facing the high-frequency circuits 21 can be formed on the surface layer of the mother control substrate 3 or, for the purpose of achieving isolation, can be formed on the inner layer of the mother control substrate 3 in order to secure some distance from the high-frequency circuits 21. For electrically-shielding the high-frequency circuits 21, the grounding conductor patterns GP, which are formed in the region facing the high-frequency circuits 21, form pseudo cavities together with shielding BGA balls arranged around the high-frequency circuits 21, grounding conductor patterns GP formed in that region on the inner layer of the high-frequency resin substrate 20 facing the high-frequency circuits 21, and grounding conductor patterns GP formed around the high-frequency circuits 21 disposed on the underside surface layer of the high-frequency resin substrate 20 (i.e., formed on the underside surface layer of the high-frequency resin substrate 20).

In FIG. 2, the BGA balls 30 are arranged in between the mother control substrate 3 and the high-frequency resin substrate 20. Among them, BGA balls 30G that are connected to grounding conductors are illustrated with hatched circles and BGA balls 30S (30S1, 30S2) that are used for signal connection are illustrated with open circles. Among the BGA balls 30G connected to grounding conductors, some are used in forming a BGA waveguide 51 described later and some are used in forming shields or achieving isolation in order to achieve operating stability in individual circuits. The former type of the BGA balls 30G are referred to by a reference numeral 30G1 and the latter type of the BGA balls 30 are referred to by a reference numeral 30G2. Meanwhile, the BGA balls 30G that are arranged around the BGA balls 30S, which are used for signal connection, and that form a coaxial interface are referred to by a reference numeral 30G3.

In FIGS. 2 and 3, in the high-frequency resin substrate 20, a waveguide-microstrip converter (hereinafter, referred to as WG-MIC converter) 50 is formed at a position facing the waveguide 5, which is formed in the mother control substrate 3. As illustrated in detail in FIGS. 4 and 5, the WG-MIC converter 50 includes the BGA waveguide 51, a waveguide opening 52, a back-short 53, and a tip-open probe 54 formed of a microstrip line.

The waveguide opening 52 is formed at a position facing the waveguide 5, which is formed in the mother control substrate 3, by partially not providing the grounding conductor pattern GP formed on the underside surface layer of the high-frequency resin substrate 20 so that a dielectric body 60 is exposed through the waveguide opening 52. The waveguide opening 52 is formed to surround the tip-open probe 54 formed of a microstrip line.

The BGA waveguide 51 includes the BGA balls 30G1 that are arranged at intervals equal to or smaller than ¼ of the free space propagation wavelength for high-frequency signals. In this portion, air is the signal transmission medium. Specifically, on the underside surface layer of the high-frequency resin substrate 20, conductor lands (exposed conducting portions) 65 are formed around the waveguide opening 52 at intervals equal to or smaller than ¼ of the free space propagation wavelength for high-frequency signals in the grounding connector pattern GP. On the lands 65 are arranged the BGA balls 30G1 (i.e., conductor lands function as conductor regions for BGA balls). Meanwhile, on the grounding conductor pattern GP formed on the surface layer, an insulating material (solder resist) is applied to the portion other than the lands 65.

The back-short 53 is a tip-short dielectric waveguide having the length of $\lambda/4$ in the lamination direction of the high-frequency resin substrate 20 from the waveguide opening 52. The back-short 53 includes the grounding conductor vias GB that are arranged at intervals smaller than $\lambda/8$ of the in-substrate effective wavelength, and includes a dielectric body, and includes a grounding conductor pattern GP (200) formed at the top end. The grounding conductor pattern GP (200) is formed on a top surface layer or on an inner layer to function as a short-circuiting plate for the dielectric waveguide. The grounding conductor pattern GP (200) is connected to the grounding conductor pattern GP formed around the waveguide opening 52 and to the grounding conductor vias GB. In the signal frequency band, the back-short 53 functions to enhance the joint condition between the waveguide 5 and the microstrip. The tip-open probe 54 is a tip-open microstrip line formed on the underside surface layer of the high-frequency resin substrate 20 in such a way that it protrudes in the waveguide opening 52. By the back-short 53, the tip-open probe 54 is disposed at a position where the standing wave distribution is the maximum, so that it can perform waveguide-microstrip conversion efficiently. As described above, according to the first embodiment, the signals from the high-frequency circuits can be input from and output to outside using waveguides. Hence, in millimeter wave bands equal to or larger than 60 GHz band, a high-frequency signal input-output interface of small size can be implemented with low loss.

Given below is an explanation regarding the high-frequency circuits for reception 21 and the high-frequency semiconductor chip 22 formed on the underside surface layer of the high-frequency resin substrate 20. The LOCAL signal input via the triplet line 6 and via the signal via 40 of the mother control substrate 3 is transmitted to the high-frequency resin substrate 20 via the BGA ball 30S1 (illustrated in the lower right part in FIG. 3). Around the BGA ball 30S1 to which the LOCAL signal is transmitted, the BGA balls 30G3 are disposed in plurality (in this example, four) to form a coaxial interface. The BGA balls 30G3 are connected to the grounding conductor pattern GP formed on the underside surface layer of the high-frequency resin substrate 20. To be precise, around the BGA ball 30S1 to which the LOCAL signal is transmitted, four of the lands 65 are formed at which the grounding conductor pattern is exposed. On those four lands are connected the BGA balls 30G3, which are arranged at intervals equal to or smaller than ¼ of the free space propagation wavelength for high-frequency signals.

To the BGA ball 30S1, to which the LOCAL signal is transmitted, are connected a conductor land 66 and a microstrip line 70 that are formed on the underside surface layer of the high-frequency resin substrate 20. To the microstrip line 70 are connected power dividers 75, and to the power dividers 75 are connected mixers 80. In this example, since there are four receiving channels, the power dividers 75 divide the LOCAL signal input to the microstrip line 70 into four signals. Each power divider 75 includes, for example, a branching circuit, an impedance converting circuit, a $\lambda g/2$ phase line, and a chip resistor 76 as the high-frequency semiconductor chip 22.

In this example, since there are four receiving channels, four mixers 80 are formed. Each mixer 80 includes an APDP (anti-parallel diode pair) 81 as the high-frequency semiconductor chip 22, a signal line, and a branching circuit formed on the underside surface layer of the high-frequency resin substrate 20. In each mixer 80, the LOCAL signal input via the power dividers 75 is mixed with an RF signal input via the tip-open probe 54, and a beat signal (IF signal) is generated that represents the component of the sum of frequencies or the difference of frequencies of the LOCAL signal and the RF signal.

The IF signal output from each mixer 80 is input to the conductor lands 66 for IF signals via an antiphase absorption circuit formed on the underside surface layer or the inner layer of the high-frequency resin substrate 20 and via an IF signal output circuit (not illustrated) of a reflective circuit. In FIG. 2, the IF signal output circuit is illustrated to be on the underside surface layer of the high-frequency resin substrate 20. In FIG. 3, the IF signal output circuit is assumed to be on the inner layer of the high-frequency resin substrate 20, and it is not illustrated. To each land 60 for IF signals is connected one of the BGA balls 30S2. Thus, the IF signals are transmitted to the mother control substrate 3 via the BGA balls 30S2. Around the BGA balls 30S2 via which the IF signals are transmitted, the BGA balls 30G3 are disposed in plurality (in this example, six). The BGA balls 30G3 are connected to the grounding conductor pattern GP. This portion also forms a coaxial circuit interface in an illustrated example. However, such coaxial circuit interface may not be formed. For example, if the IF frequency is low, then only a single BGA ball 30G3 can be disposed so that the signals can be transferred as parallel wire lines. Although the BGA balls 30G1 are assumed to be arranged at intervals equal to or smaller than ¼ of the free space propagation wavelength for high-frequency signals, the intervals can also be widened depending on the IF frequency band and by taking into consideration the interference and radioactivity. In the mother control substrate 3, the IF signals are transmitted to the control circuits mounted on the mother control substrate 3 via the signal line 42 and the signal via 43 on the surface layer and via the signal line 42 on the inner layer.

As described above, in the region of the mother control substrate 3, which faces the high-frequency circuits 21 (including the high-frequency semiconductor chip 22) such as the mixers 80, the power dividers 75, and the IF signal output circuit that are formed on the underside surface layer of the high-frequency resin substrate 20, the grounding conductor patterns GP are formed for stabilizing the operations of the high-frequency circuits 21. Similarly, on the inner layer (first layer from the underside surface layer) of the high-frequency resin substrate 20, the grounding conductor patterns GP are also formed in the region facing the high-frequency circuits 21 such as the mixers 80 and the power dividers 75. The grounding conductor pattern GP formed on the inner layer (first layer from the underside surface layer) of the high-frequency resin substrate 20 is the grounding conductor for the high-frequency circuits 21, functions as the shielding conductor for shielding the high-frequency circuits 21 and also functions as the RTN (return) conductor of the surface layer lines (microstrip lines) of the high-frequency circuits 21 that are formed on the underside surface layer of the high-frequency resin substrate 20. The grounding conductor pattern GP formed on the inner layer (first layer from the underside surface layer) of the high-frequency resin substrate 20 and the grounding conductor pattern GP formed around the high-frequency circuits 21 are connected by the grounding conductor vias GB having the same electric potential.

Explained below with reference to FIG. 3 is an arrangement of the BGA balls. In FIG. 3, on the grounding conductor pattern GP formed on the underside surface layer of the high-frequency resin substrate 20, the grounding conductor lands 65 are arranged by not providing insulating material at which the grounding conductor pattern is exposed. The intervals between the lands 65 are basically equal to or smaller than ¼ of the free space propagation wavelength for high-frequency signals. Moreover, at those surface layer positions of the mother control substrate 3 which face the arrangement positions of the grounding conductor lands 65 formed on the underside surface layer of the high-frequency resin substrate 20, identical grounding conductor lands are formed. The BGA balls 30G connect the grounding conductor lands formed on the high-frequency resin substrate 20 with the grounding conductor lands formed on the mother control substrate 3. Similarly, in order to sandwich the BGA balls 30S that are used for DC bias and signal connection of control signals or the LOCAL signal, lands for sandwiching are formed at the respective surface layer positions on the high-frequency resin substrate 20 and the mother control substrate 3. Meanwhile, in FIG. 3, the BGA balls for DC bias and for signal connection of control signals are not illustrated.

In FIG. 3, the grounding conductor pattern GP is also formed around portions 55 at which the dielectric body 60 is exposed and the mixers 80 are disposed. On the grounding conductor pattern GP formed around the mixers 80, the lands 65, to which are connected the BGA balls 30G2 used for achieving shielding or isolation, are arranged surrounding the mixers 80 at intervals equal to or smaller than ¼ of the free space propagation wavelength for high-frequency signals. The BGA balls 30G2 are connected to those lands 65. The horizontal and vertical dimensions L2 and L3 of the region surrounded by the BGA balls 30G2, which are used for achieving shielding or isolation, are set to be smaller than ½ of the free space propagation wavelength for high-frequency signals or set to avoid the length equal to ½ of the free space propagation wavelength for high-frequency signals. That is because, if the horizontal and vertical dimensions L2 and L3 match with substantially ½ of the wavelength corresponding to the operating frequency of the high-frequency circuits (i.e., match with cutoff dimensions), then resonance occurs inside the cavities thereby causing malfunctioning (undesired oscillation, frequency fluctuation) in the high-frequency circuits. Similarly, the BGA balls 30G2 are arranged in such a way that the dimension L1 is also smaller than ½ of the free space propagation wavelength for high-frequency signals. That is done because the signals spatially propagate between the cavities housing the circuits thereby causing malfunctioning (undesired oscillation, frequency fluctuation) in the high-frequency circuits due to feedback/joining.

As described above, in the region (on the surface layer or on the inner layer) of the mother control substrate 3, which face the mounting regions of the high-frequency circuits such as the mixers 80, the grounding conductor patterns GP are formed. The grounding conductor patterns GP form pseudo shielding cavities as shielding enclosures together with the BGA balls 30G2 that are arranged around the mixers 80 and used for achieving shielding or isolation, the grounding conductor pattern GP formed at the positions facing the mounting regions of the high-frequency circuits on the inner layer (first layer from the underside surface layer) of the high-frequency resin substrate 20, and the grounding conductor pattern GP formed on the underside surface layer (or the inner layer) of the high-frequency resin substrate 20 and around the mounting regions of the high-frequency circuits. In this way, the high-frequency circuits are individually partitioned and are further partitioned on a channel-by-channel basis by pseudo shielding cavities that are formed using the BGA balls 30G2 and grounding conductor patterns GP facing the high-frequency circuits. Thus, shielding of the high-frequency circuits or isolation among channels can be achieved using a simple and inexpensive configuration and not using any lid.

In FIG. 3, the grounding conductor pattern GP is also formed around the power dividers 75. On the grounding conductor pattern GP formed around the power dividers 75, the lands 65 and the BGA balls 30G2 are also formed so as to surround the power dividers 75 at intervals equal to or smaller than ¼ of the free space propagation wavelength for high-frequency signals. Moreover, the grounding conductor pattern GP is also formed at those positions on the mother control substrate 3 which face the mounting positions of the power dividers 75. Furthermore, the grounding conductor pattern GP is also formed on the inner layer (first layer from the underside surface layer) of the high-frequency resin substrate facing the mounting regions of the power dividers 75. Because of such grounding conductor patterns GP, similar pseudo shielding cavities are formed as shielding enclosures.

Moreover, in FIG. 3, in order to achieve isolation among the receiving channels, the BGA balls 30G2 are also arranged between the high-frequency circuits of each receiving channel, that is, between the mixers 80. Besides, in order to electromagnetically shield the circuits in entirety, the BGA balls 30G2 are also arranged around the circuits in entirety.

Meanwhile, other than the configuration illustrated in FIG. 1, the transmitting circuit package TX can also be configured with a multilayer dielectric substrate made of ceramic, high-frequency circuits for transmission mounted on the multilayer dielectric substrate, and a lid for shielding the high-frequency circuits as disclosed in Japanese Patent Application Laid-open No. 2002-185203 or in Japanese Patent Application Laid-open No. 2004-254068. In this case, the operations of the high-frequency circuits for transmission are controlled by the above-mentioned control circuits mounted on the control antenna substrate 1. The high-frequency circuits transmit transmitter pulses via a microstrip line-waveguide converter and via the transmitting waveguide 4 and an antenna formed on the control antenna substrate 1.

Furthermore, in the receiving circuit package RX or in the transmitting circuit package TX, as long as the size of the high-frequency resin substrate 20 does not cause cracks or peeling in the base material at the joints with the mother substrate, the multilayer resin substrate can be replaced with a multilayer ceramic substrate as the material for the high-frequency resin substrate 20.

Besides, if the restrictions on the BGA balls 10 are not severe from the manufacturing perspective or from the cost perspective, then the solder balls can be replaced with gold bumps and joining can be done using pressure bonding. Moreover, if the restrictions are not severe from the manufacturing perspective, from the cost perspective, or from the reliability perspective; then the BGA balls 10 can be replaced with conductive blocks or conductive fillers for the purpose of connection.

Figure 6:
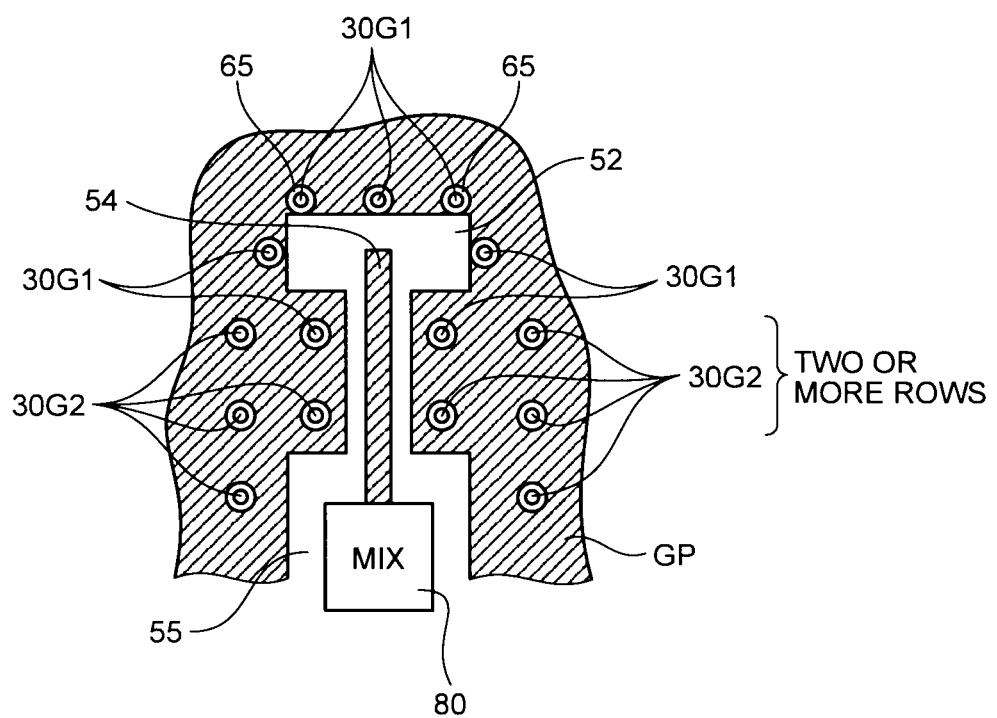
FIG. 6 is a plan view of another arrangement example of high-frequency circuits, high-frequency semiconductor chips, and BGA balls formed on the underside surface layer of a high-frequency resin substrate in the high-frequency circuit package according to the embodiment of the present invention.

FIG. 6 illustrates another arrangement example of the BGA balls that are arranged around the portion 55 at which the dielectric body 60 is exposed and at which the waveguide opening 52 and the mixer 80 are disposed. In FIG. 6, the waveguide opening 52 and the exposed portion 55 are spaced apart by a larger distance than the distance illustrated in FIG. 3, and two or more rows of the BGA balls are arranged in between the waveguide opening 52 and the exposed portion 55 (two rows in FIG. 6). Similarly to the case illustrated in FIG. 3, the BGA balls are arranged at intervals equal to or smaller than ¼ of the free space propagation wavelength for high-frequency signals. In this way, by arranging two or more rows of the BGA balls in between the waveguide opening 52 and the exposed portion 55, there is an enhancement in the shielding between the WG-MIC converter 50 and the mixer 80, and each circuit performs operations in a stable manner.

As described above, according to the present embodiment, the high-frequency circuits formed on the underside surface layer of the high-frequency resin substrate 20 are housed inside pseudo shielding cavities that are surrounded by the BGA balls formed around the high-frequency circuits, surrounded by the grounding conductors disposed at the regions facing the high-frequency circuits, and surrounded by the grounding conductors formed around the high-frequency circuits. As a result, it becomes possible to electromagnetically shield the high-frequency circuits using a simple and inexpensive configuration and not using any lid. Incidentally, the high-frequency circuits are housed in a non-airtight manner between the high-frequency resin substrate 20 functioning as a first dielectric substrate and the mother control substrate 3 functioning as a second dielectric substrate. Moreover, the high-frequency circuits that are formed on the underside surface layer of the high-frequency resin substrate 20 and that correspond to the plurality of channels are shielded by creating channel-based partitions with pseudo shielding cavities. Hence, it becomes possible to achieve isolation among the channels using a simple and inexpensive configuration and not using partitioning members such as a seal ring.

Moreover, according to the present embodiment, implementing the BGA connection structure makes it possible to provide a high-frequency housing case that includes a waveguide interface (BGA waveguide 51), coaxial interfaces (BGA balls 30S1 and 30S2), and a shield/isolation structure (pseudo shielding cavities). Therefore, it becomes possible to provide an inexpensive sensor module having superior potential for high-volume production.

INDUSTRIAL APPLICABILITY

In this way, the high-frequency circuit package and the sensor module according to the present invention are suitable for mounting high-frequency circuits between substrates.

REFERENCE SIGNS LIST

1 CONTROL ANTENNA SUBSTRATE
2 RESIN ANTENNA SUBSTRATE
3 MOTOR CONTROL SUBSTRATE
4 TRANSMITTING WAVEGUIDE
5 RECEIVING WAVEGUIDE
6 TRIPLET LINE
10 BGA BALL
20 HIGH-FREQUENCY CIRCUIT MOUNTING SUBSTRATE (HIGH-FREQUENCY RESIN SUBSTRATE)
21 HIGH-FREQUENCY CIRCUIT
22 HIGH-FREQUENCY SEMICONDUCTOR CHIP
30 BGA BALL
30G, 30G1, 30G2, 30G3 BGA BALL (GROUND CONNECTION)
30S, 30S1, 30S2 BGA BALL (FOR SIGNAL)
40, 43 SIGNAL VIA
41 CONTACT PARD
42 SIGNAL LINE
50 WAVEGUIDE-MICROSTRIP CONVERTER
51 BGA WAVEGUIDE
52 WAVEGUIDE OPENING
53 BACK-SHORT
54 TIP-OPEN PROBE
55 PORTION OF EXPOSED DIELECTRIC BODY
60 DIELECTRIC BODY
65 CONDUCTOR LANDS (GROUND CONNECTION)
66 CONDUCTOR LANDS (SIGNAL CONNECTION)
70 MICROSTRIP LINE
75 POWER DIVIDER
76 CHIP RESISTOR
80 MIXER
81 APDP
90 HIGH-FREQUENCY CIRCUIT MOUNTING SUBSTRATE
91 HIGH-FREQUENCY CIRCUIT FOR TRANSMISSION
92 HIGH-FREQUENCY SEMICONDUCTOR CHIP FOR TRANSMISSION
100 Au BUMP
GB GROUNDING CONDUCTOR VIA
GP GROUNDING CONDUCTOR PATTERN
RX RECEIVING CIRCUIT PACKAGE
TX TRANSMITTING CIRCUIT PACKAGE

The invention claimed is:

1. A high-frequency circuit package comprising:
a first dielectric substrate having a high-frequency circuit formed and disposed on an underside surface layer and having a first grounding conductor that has a same electric potential as a grounding conductor of the high-frequency circuit and that is formed on the underside surface layer to surround the high-frequency circuit;
a second dielectric substrate, on which the first dielectric substrate is mounted in such a way that the high-frequency circuit is sandwiched therebetween, the second dielectric substrate having a second grounding conductor formed in a region that faces the high-frequency circuit; and
solder balls for connecting a plurality of conductor lands and surrounding the high-frequency circuit at positions at which the first and second grounding conductors face each other, the conductor lands being arranged at intervals smaller than ¼ of an operating signal wavelength for the high-frequency circuit, wherein
the high-frequency circuit is housed in a pseudo shielding cavity that is formed due to mutual connection established between the first and second dielectric substrates by the solder balls, and that includes the plurality of solder balls, the first and second grounding conductors, and the grounding conductor of the high-frequency circuit,
the first dielectric substrate includes
a microstrip line that is connected to the high-frequency circuit and that is formed on the underside surface layer;
a waveguide opening formed by partially not providing the first grounding conductor so as to surround a tip-open portion of the microstrip line; and
a tip-short dielectric waveguide that is electrically connected to the waveguide opening and that has the length of substantially ¼ of an in-substrate effective propagation wavelength for high-frequency signals in a substrate lamination direction from the waveguide opening;
the second dielectric substrate includes a waveguide that is formed at a position facing the waveguide opening and that is formed in a substrate lamination direction, and
a plurality of waveguide conductor lands, which are arranged at positions of the first and second grounding conductors facing each other at intervals equal to or smaller than ¼ of a free space propagation wavelength for high-frequency signals so as to surround the waveguide opening and the waveguide, are mutually connected by solder balls to take out an input-output signal of the high-frequency circuit through the waveguide of the second dielectric substrate.

2. The high-frequency circuit package according to claim 1, wherein
the first dielectric substrate includes, on the underside surface layer,
a first wiring pattern that is connected to the high-frequency circuit and that transmits a DC bias and a control signal for driving the high-frequency circuit; and
first signal lands connected to the wiring pattern;
the second dielectric substrate includes
a DC power source and a control circuit mounted thereon for driving the high-frequency circuit;
the second dielectric substrate includes, on a mounting surface for the first dielectric substrate, a second wiring pattern for transmitting signals from the DC power source and the control circuit; and a plurality of second signal lands that are connected to the second wiring pattern and that are formed at positions facing the first signal lands; and the first and second signal lands facing each other are mutually connected by solder balls so that the DC power source and the control circuit mounted on the second dielectric substrate drive the high-frequency circuit mounted on the first dielectric substrate.

3. The high-frequency circuit package according to claim 1, wherein the second grounding conductor formed on the second dielectric substrate is electrically connected to the plurality of conductor lands that surround the high-frequency circuit at intervals smaller than ¼ of an operating signal for the high-frequency circuit and is formed on the surface layer or the inner layer of the second dielectric substrate.

4. The high-frequency circuit package according to claim 1, wherein horizontal and vertical dimensions of a region, which is surrounded by the solder balls for connecting the plurality of conductor lands that are formed to surround the high-frequency circuit at positions at which the first grounding conductor and the second grounding conductor face each other and that are arranged at predetermined intervals smaller than ¼ of an operating signal wavelength for the high-frequency circuit, are set to be smaller than ½ of a free space propagation wavelength for high-frequency signals or set to avoid the length equal to ½ thereof.

5. The high-frequency circuit package according to claim 1, wherein
a plurality of the high-frequency circuits are formed and disposed on the underside surface layer of the first dielectric substrate,
the first dielectric substrate includes a plurality of the microstrip lines respectively connected to the plurality of high-frequency circuits, a plurality of the waveguide openings, and a plurality of the tip-short waveguides,
the second dielectric substrate includes a plurality of the waveguides formed at positions facing the plurality of waveguide openings and formed in a substrate lamination direction, and
the plurality of waveguide conductor lands, which are arranged on the first grounding conductor and on the second grounding conductor at positions facing each other at intervals equal to or smaller than ¼ of a free space propagation wavelength for high-frequency signals to surround the plurality of waveguide openings and the plurality of waveguides, are mutually connected by the solder balls to take out an input-output signal of each of the high-frequency circuits through the waveguides of the second dielectric substrate.

6. The high-frequency circuit package according to claim 1, wherein the high-frequency circuit is housed in a non-airtight manner in between the first dielectric substrate and the second dielectric substrate.

7. A sensor module comprising:
the high-frequency circuit package according to claim 1; and
an antenna that is disposed on the second dielectric substrate on the opposite side of the mounting surface for the first dielectric substrate and that is connected to the waveguide.

8. A high-frequency circuit package for housing a high-frequency circuit, comprising:
a high-frequency circuit mounting substrate as a first dielectric substrate that includes
a microstrip line that is connected to the high-frequency circuit formed on an underside surface layer and that is formed on the underside surface layer;
a waveguide opening that is formed to surround a tip-open portion of the microstrip line and that is formed by not providing a first grounding conductor formed on the underside surface layer;
a tip-short dielectric waveguide having a length of substantially ¼ of an in-substrate effective propagation wavelength for high-frequency signals in a substrate lamination direction from the waveguide opening;
a first solder-ball-mounting conductor land group arranged on the first grounding conductor, so as to surround the waveguide opening, at intervals equal to or smaller than ¼ of a free space propagation wavelength for high-frequency signals;
a second grounding conductor disposed around the high-frequency circuit;
a third grounding conductor that functions as a return conductor for the high-frequency circuit and for the microstrip line, and that is formed on a substrate inner layer;
a second solder-ball-mounting conductor land group arranged on the second grounding conductor, so as to surround the high-frequency circuit, at intervals equal to or smaller than ¼ of a free space propagation wavelength for high-frequency signals; and
a third solder-ball-mounting conductor land group that functions to transmit a DC bias and a control signal for driving the high-frequency circuit;
a mother control substrate as a second dielectric substrate, on which the high-frequency circuit mounting substrate is mounted in such a way that the high-frequency circuit is sandwiched therebetween, the mother control substrate including
a fourth grounding conductor formed in a region that faces the high-frequency circuit mounted on the high-frequency circuit mounting substrate;
a plurality of fourth conductor land groups that are electrically connected to the fourth grounding conductor and that are formed at positions facing the first, second, and third solder-ball-mounting conductor land groups;
a waveguide formed at a position facing the waveguide opening of the high-frequency circuit mounting substrate and formed in a substrate lamination direction; and
a line that transmits a DC bias and a control signal for driving the high-frequency circuit; and
a solder ball group for connecting the first to third solder-ball-mounting conductor land groups with the plurality of fourth conductor land groups, wherein
the high-frequency circuit is housed in a pseudo shielding cavity formed by the solder balls connected to the second solder-ball-mounting conductor land group and by the second to fourth grounding conductors.

9. The high-frequency circuit package according to claim 8, wherein
the high-frequency circuit mounting substrate includes, on the underside surface layer, a first wiring pattern that is connected to the high-frequency circuit and to the third solder-ball-mounting conductor land group, and that transmits a DC bias and a control signal for driving the high-frequency circuit,
the mother control substrate includes
a DC power source and a control circuit mounted thereon for driving the high-frequency circuit;

the mother control substrate includes, on a mounting surface for the high-frequency circuit mounting substrate,
the line that is connected to the DC power source and the control circuit for transmitting the DC bias and the control signal; and
fifth conductor lands that are connected to the line and included in the plurality of fourth conductor land groups, and that are formed at positions facing the third solder-ball-mounting conductor land group; and
the third solder-ball-mounting conductor land group and the fifth conductor lands facing each other are mutually connected by the solder balls so that the DC power source and the control circuit mounted on the mother control substrate drive the high-frequency circuit mounted on the high-frequency circuit mounting substrate.

* * * * *